United States Patent [19]
Phipps et al.

[11] 3,965,963
[45] June 29, 1976

[54] MOLD AND PROCESS FOR CASTING HIGH TEMPERATURE ALLOYS

[75] Inventors: Charles M. Phipps, Ridgewood, N.J.; Douglas R. Hayes, Vernon, Conn.

[73] Assignee: United Technologies Corporation, Hartford, Conn.

[22] Filed: May 2, 1975

[21] Appl. No.: 574,122

Related U.S. Application Data

[63] Continuation-in-part of Ser. No. 416,563, Nov. 16, 1973, abandoned.

[52] U.S. Cl. .................. 164/60; 164/127; 164/365; 249/125; 249/146
[51] Int. Cl.² .............. B22C 9/24; B22D 25/06
[58] Field of Search ............ 164/60, 122, 125, 127, 164/129, 350, 351, 364, 365; 249/125, 129, 142, 146, 154

[56] References Cited
UNITED STATES PATENTS 3,627,015  12/1971  Giamei ................................ 164/23
3,908,733  9/1975  Brazer et al. ........................ 164/60

FOREIGN PATENTS OR APPLICATIONS 36-8560  12/1959  Japan ................................. 164/349

Primary Examiner—Francis S. Husar
Assistant Examiner—Carl Rowold
Attorney, Agent, or Firm—Charles A. Warren

[57] ABSTRACT

In the manufacture of hollow turbine blades or vanes especially those having a columnar crystalline growth in the alloy, the blade is cast in two opposed halves against a central mold element, the latter being rigid enough to avoid deformation during heating of the mold prior to pouring and during solidification. This central element has on opposite surfaces the configurations of the inner surfaces of the hollow blade. Cooperating with this inner element are outer elements having cooperating inner surface configurations of the convex and concave sides of the blade respectively. After the blade halves are cast simultaneously in the assembled mold and removed therefrom they are bonded together to form a complete blade.

12 Claims, 14 Drawing Figures

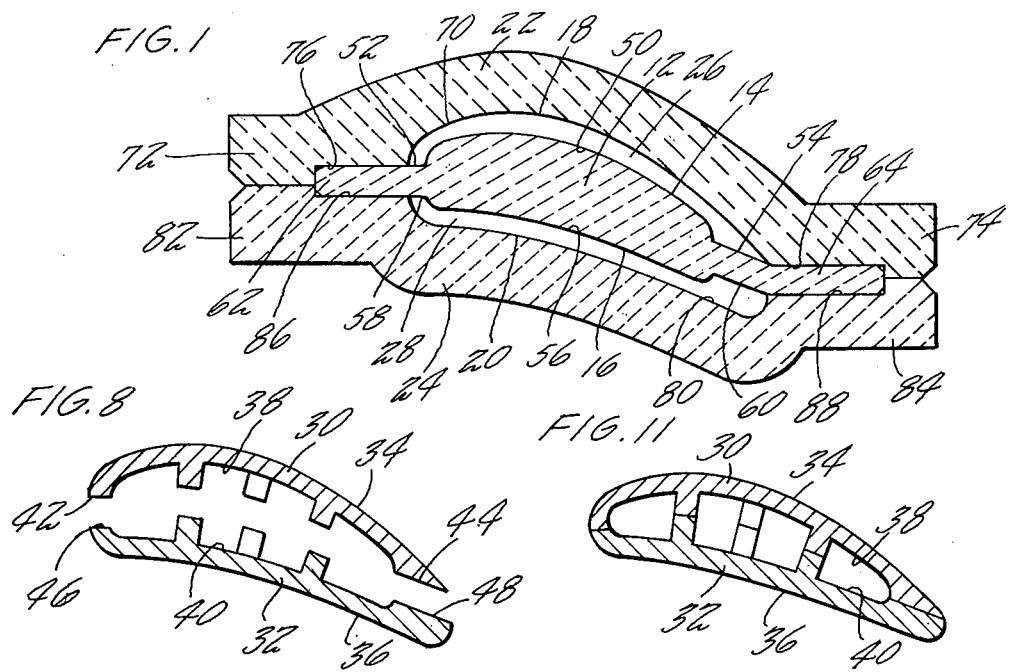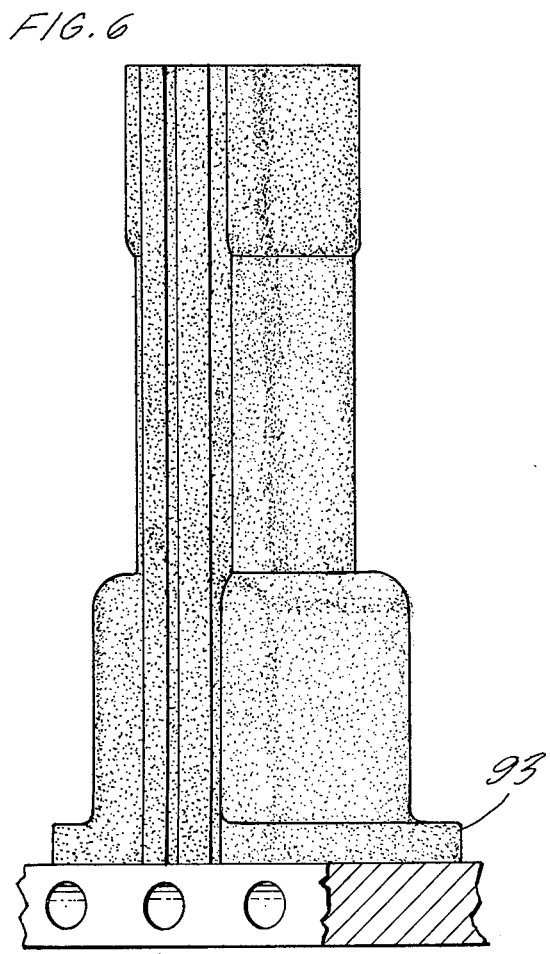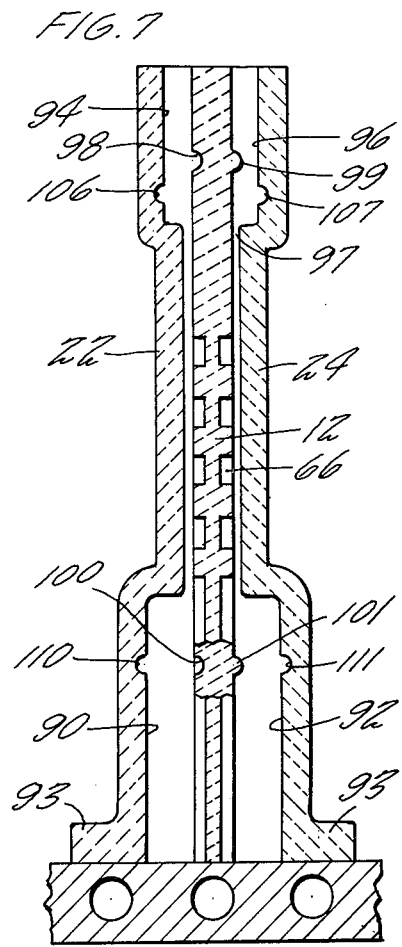

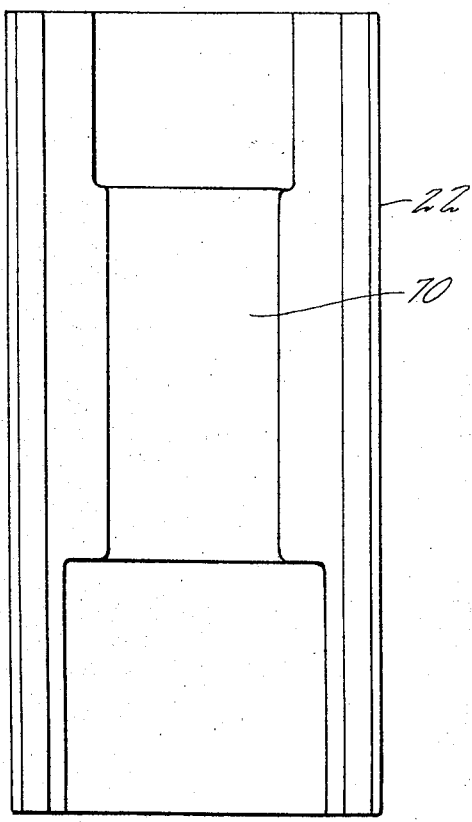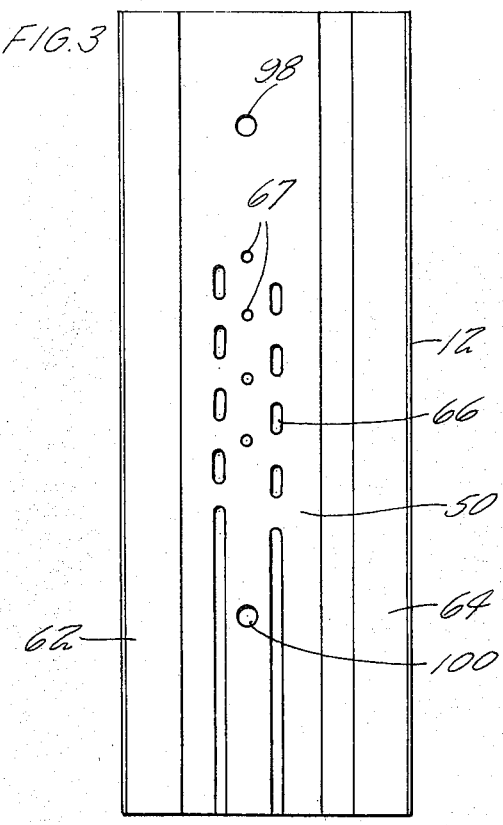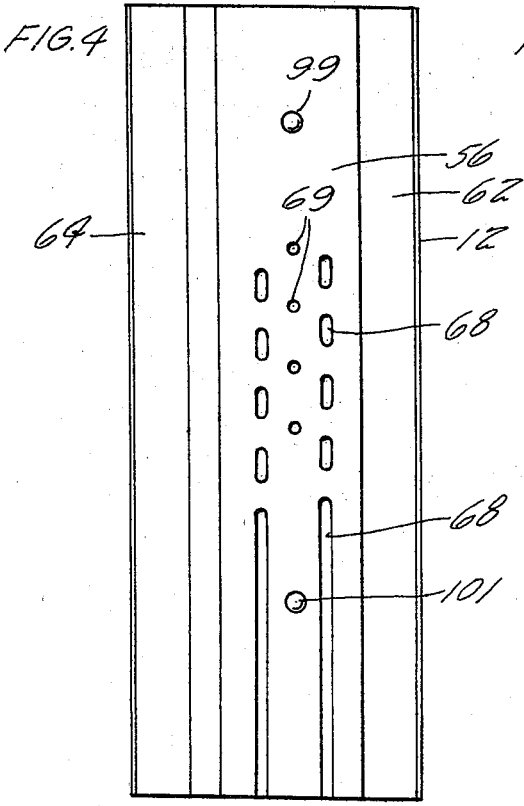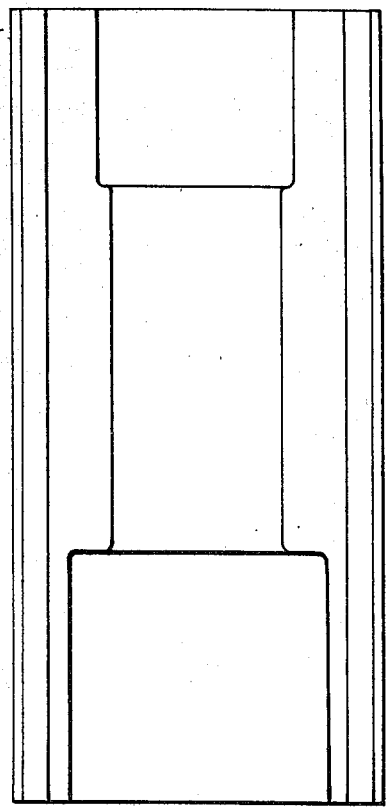

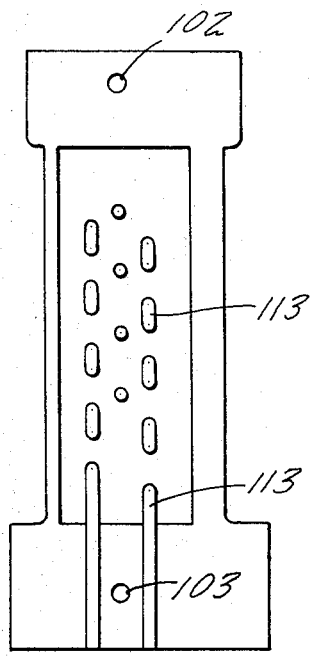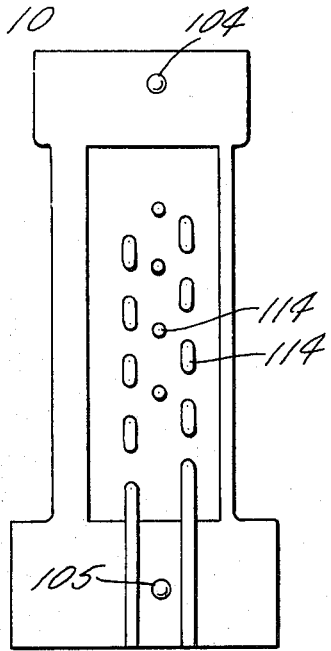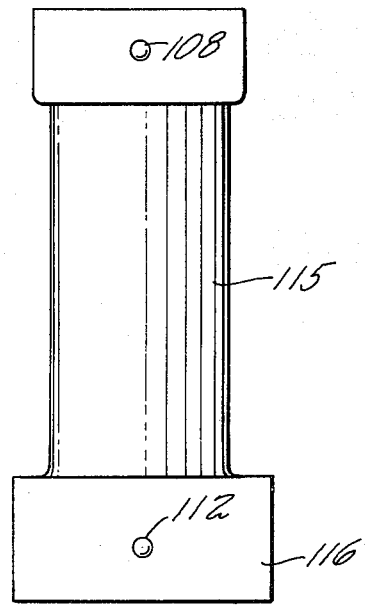

MOLD AND PROCESS FOR CASTING HIGH TEMPERATURE ALLOYS

This application is a continuation-in-part of application U.S. Ser. No. 416,563 filed Nov. 16, 1973, now abandoned.

BACKGROUND OF THE INVENTION

In modern gas turbines, especially high performance turbine engines as in aircraft, the turbine must operate at a very high temperature. For the blades, both stationary and moving, to have an adequate life under such extreme temperature conditions, for example, a turbine inlet gas temperature of 2400°F, the blades must be very thoroughly and effectively internally cooled. The best of the known superalloys used for these blades are limited to operation at a temperature several hundred degrees below their melting points but the maximum operating temperature is set as high as possible.

To make the blades hollow with adequately shaped coolant passages therein, the blades are cast in a mold having a core therein to form the cavity in the cast blade. Such core is fragile, subject to distortion and partial disintegration during the casting operation, and must be completely removed when the cast blade has cooled. Complete removal necessitates a core material that disintegrates readily in a solution that will not react with the blade alloy. Even then, inspection of the shape of the cavity and the passages formed therein is almost impossible. The entire problem is aggravated when the blades are made with a columnar crystalline structure in the alloy, as the casting process takes a longer time with resultant greater possibility for mold or core deterioration or distortion. Such columnar structure is described and claimed in VerSnyder U.S. Pat. No. 3,260,505 or, a particular form of columnar structure, single crystal, in Piearcey U.S. Pat. No. 3,494,709.

Blades are cast by the lost wax process in which a wax pattern is coated with mold material to the desired thickness and when the mold is then cured the wax melts out leaving a cavity in the mold the shape of the finished blade. The mold with a growth zone at one end and a filling spout and passage at the other frequently also a part of the lost wax process, is then filled with alloy in producing the cast blade. If the blade is hollow, the wax pattern has inserted therein a core that is the shape of the blade cavity and this core remains in the mold when the wax melts out.

Adequate inspection of the inner surfaces of the mold, and of the location and completeness of the core prior to the casting process is impossible because of the one-piece mold. Thus the casting must be made without knowing that the blade surfaces, even the external surfaces will be satisfactory.

When blades are cast in this manner, the core material must be leachable so as to remove the core from the finished casting. Thus, the materials available for the core are extremely limited and most of the usable materials are not high strength materials nor can they readily withstand the heat from the alloy being cast. Thus, many castings are unacceptable because of core failure. Again, inspection of the cored surfaces of the finished blade is very difficult if not impossible.

SUMMARY OF THE INVENTION

The present invention contemplates making the blade in two halves, with the halves cast against opposite sides of a central mold member that is precast from a high strength ceramic, this central mold member having the internal configuration of the blade formed on the opposite sides thereof. The outer surface configurations of the blade are formed on the inner surfaces of opposed outer mold elements positioned on opposite sides of the central member and held in position by the central element. The blade halves are cast simultaneously on opposite sides of the central member and are subsequently, when removed from the mold, cleaned and inspected and then bonded together to form a complete blade with the desired arrangement of coolant passages in the cavity therein. With the mold in several pieces, the inner surfaces may be readily inspected before assembly of the several elements. With the central element relatively thick and of a high strength ceramic, the opposed blade elements will be cast precisely such that they will mate with the necessary precision for subsequent bonding into a finished blade.

When making columnar growth castings the outer mold elements may project beyond the blade configuration at one end to form a growth cavity, which rests on a chill plate and which selects the crystalline growth desired for both blade halves. This growth zone of the cast article is removed from the blade halves after they are solid and cooled. In this case also the central element is of adequate thickness to impart strength and heat resistance to assure precise casting of the opposed parts of the blade.

The foregoing and other objects, features and advantages of the present invention will become more apparent from the following detailed description of the preferred embodiment illustrated in the accompanying drawing.

BRIEF DESCRIPTION OF THE DRAWING

FIG. 1 is a horizontal sectional view through an assembled mold for making the blade halves.

FIG. 2 is a plan view of the inside of one of the outer mold elements.

FIG. 3 is a plan view of the side of the central mold element cooperating with the outer mold element of FIG. 2.

FIG. 4 is a plan view of the opposite side of the central mold element.

FIG. 5 is a plan view of the inner surface of the outer mold element cooperating with the side of the center element shown in FIG. 4.

FIG. 6 shows the complete mold positioned on a chill plate ready to be heated for the casting operation.

FIG. 7 is a vertical sectional view through the mold of FIGS. 1 and 6.

FIG. 8 is a sectional view through the opposed blade halves cast in the mold of FIG. 1.

FIG. 9 is a plan view of the inner surface of the concave half of the blade.

FIG. 10 is a plan view of the inner surface of the convex half of the blade.

FIG. 11 is a sectional view through the assembled blade.

FIG. 12 is a plan view of the completed blade before removal of the top portion.

DESCRIPTION OF THE PREFERRED EMBODIMENT

Figure 13:
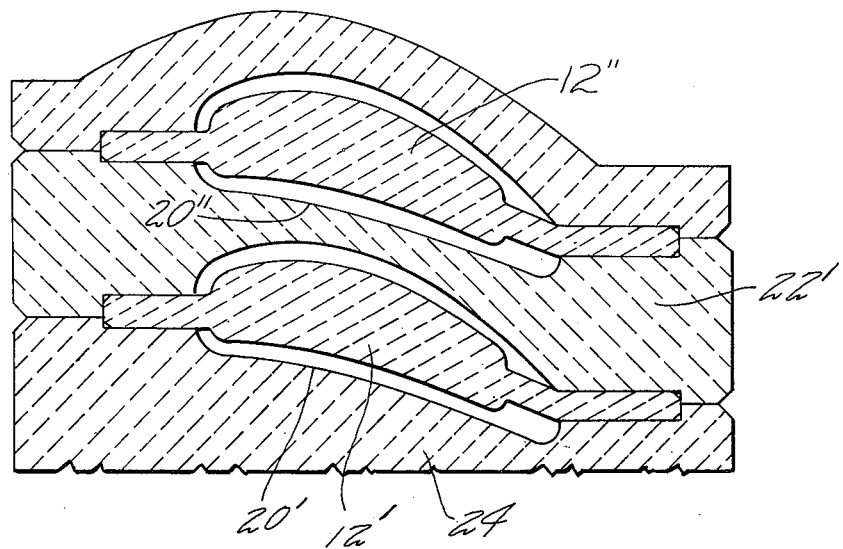
FIG. 13 is a view similar to FIG. 1 of a modification.

Referring first to FIG. 1, the mold is made up of a central element 12 or strongback, having opposed side surfaces 14 and 16 cooperating with the inner surfaces 18 and 20 of outer mold elements 22 and 24 to define cavities 26 and 28 in which the blade halves are to be cast. The blade halves are shown in section in FIG. 8.

Referring to FIG. 8 the blade as cast is in halves 30 and 32, the half 30 being convex on the outer surface 34 and the half 32 being concave on the outer surface 36. Thus, the inner surface 38 of the half 30 is concave and the inner surface 40 of the half 32 is convex. At the outer edges the blade halves have cooperating surfaces by which the halves are bonded together for making the complete blade, blade half 30 having the flat surfaces 42 and 44 at opposite edges to cooperate with similar flat surfaces 46 and 48 respectiveley on the blade half 32.

The central element is a performed element and is made thick enough from a rigid "strongback" that will retain its rigidity during preheating of the mold in readiness for pouring and during solidification of the alloy in the mold in the process of casting columnar grained articles. This element is preferably formed from a high-strength ceramic, for example, a base mixture essentially of approximately 70% silica and 30% zirconia. One high strength ceramic is SR200-2 and another is SR605 both of which are products of Sherwood Refractories. Either of these can withstand a preheat temperature of 2900°F, and will retain the desired precise configuration and dimension. This element may be whatever thickness is necessary to provide the desired strength to this element and also to reenforce the outer elements 22 and 24, for example, the outer edges of the element may be 3/16 of an inch or more.

The central element 12 has on the side surface 14 thereof a configuration matching, in reverse, the inner surface of the convex half of the finished blade. To this extent the central part of the surface 14 is generally convex at 50, since the inner surface of the blade half 30 is concave. The opposite side surface 16 of the central element 12 is generally concave and is the reverse of the surface 40 on blade half 32. At opposite edges of the convex blade forming portion on surface 14 are flat narrow surfaces 52 and 54 to form the flat surfaces 42 and 44 on blade half 30.

On the opposite side surface 16, at the opposite edges of the central concave blade forming portion 56 are flat narrow surfaces 58 and 60 to form the surfaces 46 and 48 on the cast blade half 32. An edge flange 62 projects beyond the opposite surfaces 52 and 58 at that edge of the central element and a projecting edge flange 64 projects beyond the flat surfaces 54 and 60 at the opposite edge of the central element. The flanges 62 and 64 are preferably parallel to one another although not in the same plane. The opposite surfaces of each flange are parallel to one another. Thus, one side of the central element is constructed to produce the inner surface of one blade half and the other side will form the inner surface of the other blade half. As above stated, this central element may be of material tailored for strength and reaction since no leaching is necessary in its removal. The element may also be made of such thickness as is necessary to have adequate rigidity to hold the opposed surfaces in appropriate relation to the cooperating surfaces of the outer mold elements during heating of the mold, pouring the alloy therein and cooling the alloy and mold.

To assure precision, the central element is of uniform thickness from end to end between the opposed surfaces 52 and 58, and also of uniform thickness between the opposed surfaces 54 and 60. In precasting this central element the precision of the element is limited only by the precision of the dies in which the element is pressed into shape. For example, with adequate control of the mold the mating surfaces may be controlled to within 0.001 inch and it has been found that the peripheral mating portions of the blade halves, defined by these surfaces, will when cast, be within a limit of 0.002 inches. The result is that when the two halves are secured together in a bonding operation, there will be a good bond over the entire area of the mating surfaces.

Referring now to FIGS. 3 and 4, the convex and concave surfaces 50 and 56 respectively have appropriate slots 66 and/or other shaped recesses 67 in surface 50 and slots 68 and other recesses 69 in surface 56 to form, in the finished cast blade halves, the desired ridges 66' or projections 67' on blade half 30 and ridges 68' and projections 69' on blade half 32, FIG. 8 to define the cooling air paths in the complete blade. Since the projections or ridges must cooperate on the opposed blade halves, these slots or recesses 66 and 68 are in mirror relation to one another as seen in FIGS. 3 and 4.

Obviously by precision in the mold that produces this central element, the depths of the slots and recesses in the central element will be so precisely controlled that the ridges and projections in the respective blade halves will also be within 0.002 inches so that bonding at these mating surfaces will be as complete as along the peripheral mating surfaces on the blade halves. It may be emphasized that with the arrangement described it is possible to inspect this central element thoroughly and check the precise spacing of the opposed surfaces on the element so as to assure adequate precision in the blade halves cast on opposite sides of the element. It may be noted that this arrangement places a significant strength in the central element in contrast to the complete absence of strength in the conventional cores that would be used in producing a one-piece blade. The selection of high strength materials is much broader because it is unnecessary that the ceramic be leachable.

The outer mold element 22 has an inner concave blade forming surface 70 centrally of the inner surface 18 and in opposed relation to surface 50 when the mold elements are assembled. This element 22 has projecting flanges 72 and 74 along opposite edges to cooperate with the flanges 62 and 64 on the central member in holding the surface 70 in the desired spaced relation to surface 50 to produce the desired thickness for the blade half 30. Each flange 72 and 74 has a notch 76 and 78 respectively therein on its inner surface to receive the end edges of flanges 62 and 64 and accurately locate the central element laterally with respect to outer element 22. Obviously, the convex surface 70 produces the airfoil portion of the blade half 30.

The other outer mold element 24 is similar to element 22. It has a central inner convex blade forming surface 80 with projecting flanges 82 and 84 along opposite edges to cooperate with the flanges 62 and 64 respectively on the central member in holding the surface 80 in the desired spacing from surface 56 to produce the desired thickness of alloy in the blade half 32. Each flange 82 and 84 has a notch 86 and 88 respectively therein to receive the end edges of flanges 62 and 64 and accurately locate the central element 12 and outer element 24 in lateral relation to one another.

As the central element is made very precise in dimension as above stated, this precision including the thickness of flanges 62 and 64 and also the end edges of these flanges, the desired precision in the thickness of the cast blade halves may be obtained as well as precision of the widths of the mating surfaces of the blade halves. This latter results from the lateral location of the outer mold elements laterally on the central element by the precision of the notches 76 and 78 on element 22 and the notches 86 and 88 on element 24. Cast blade halves have been made with this arrangement in which the tolerances have all been less than 0.002 inches.

These outer elements may be made of a less strong refractory because of the rigidity provided by the central element. For example, this ceramic may be a zirconia base with alumina and silica added to it. The essential here is that the elements retain their integrity during mold heating, pouring and cooling and to have compatible thermal expansion coefficients with the central element.

In addition to the configuration of the mold elements as above described, the lower end of each outer element 22 and 24 has a larger rectangular recess 90, 92 respectively, to cooperate in defining a combined blade root cavity and a growth or crystal selector cavity. The lower half of the cavity acts to establish a columnar crystalline growth as described in VerSnyder U.S. Pat. No. 3,260,505 and this portion of the cast article is removed before the cooperating blade halves are put together. Although it is not necessary, the central element 12 may extend downwardly the same distance as the outer elements to form a divider for the root and growth cavity. Thus, all three elements would project so as to be in contact with the chill plate as in FIG. 7, when the mold is ready for a casting operation. In this event, the thickness of the central element through the root cavity is maintained the same as the thickness between surfaces 52 and 58 to assure mating of the root halves as precisely as the surfaces 42 and 46 or 44 and 48 mate. At the base of the outer mold elements suitable flanges 93 may be provided for holding the mold assembly on the chill plate.

Should it be desirable the central element 12 could be shortened to extend only partway into the root and growth cavity thus forming a divided root cavity but a single growth cavity. The same precise thickness of the central element in the root cavity will also be maintained here.

At the opposite ends of the outer mold elements, at the top, there is a recess 94 and 96 in elements 22 and 24 respectively to form a riser cavity. The effective portion of the blade terminates at the top 97 of the airfoil shaped surfaces of the outer mold elements as will be understood.

The mold elements are precast and, once a suitable metallic die is made for each of the mold elements they may be produced in quantity with the appropriate die and from suitable mold material that may be a much more stable material than that used in the conventional lost wax process. The materials usable for this purpose will be familiar to one skilled in the art. The materials, particularly the central element will have the desired high strength to provide the strongback to assure the production of mating blade halves that will contact over the entire areas to be bonded together. Further, the material will desirably be one that does not detrimentally react with the alloy as for example in depleting the alloy of any of the reactive elements therein or in contamination of the molten alloy before solidification.

Another particularly important feature is the possibility for precise control of all blade dimensions. Each mold element be precisely formed to assure such accuracy of dimension as to produce blade halves within the permissible tolerances. The alloy contacting surfaces of each of the completed mold elements may also be carefully and completely inspected prior to assembly into a mold to assure a casting of the desired configuration. With a rigid central element the desired precision of dimension and surface will be produced dependably in the finished cast blade halves.

The mold elements may also be configured to provide locating points for the two cast blade halves. As shown in FIG. 7, the opposite sides of the central member 12 have respectively a detent 98 and a mating protuberance 99 located on the riser portion of the mold element close to the outer end of the blade forming part of the mold. A similar detent 100 and protuberance 101 are formed in the root portion of the central member 12 in mating locations. When the blade halves are cast, the protuberances 102 and 103 on the cast parts will fit in the detents 104 and 105 respectively and accurately locate the mating blade halves in the precise location for bonding the halves together.

For the purpose of inspecting the completed blade halves or the completed blade other mating locating means may be cast in the outer surfaces of the blade. To this end the recesses 94 and 96 in the outer mold portions may have precisely located detents 106 and 107 therein to form locating buttons 108 one of which is shown in FIG. 12 for the purpose of locating the cast blade in an inspecting device for checking the accuracy of the airfoil. Other detents 110 and 111 formed in the recesses 90 and 92 will produce locating buttons 112 only one of which is shown in FIG. 12. It will be understood that the precision of the investment casting process as well as the precision in the production of the mold elements will produce accurately located and precisely shaped buttons and detents on the cast articles to function as above described.

The three elements are assembled as in FIG. 1 and suitably clamped together to form a complete mold. A filler spout and passage of suitable mold material may be attached to the top and the mold assembly is ready for the casting operation. If the casting is to be columnar grained as above described, the mold is placed in a furnace and heated to a temperature above the melting point of the alloy. The molten alloy, with several hundred degrees of superheat is poured into the heated mold and the solidification process is started from the chill plate upwardly by controlling the thermal gradient in the mold as described in either VerSnyder U.S. Pat. No. 3,260,505 or Piearcey U.S. Pat. No. 3,494,709. The crystalline growth in both halves will be similar and matching blade halves will be produced.

The slots 66 and 68 and recesses 67 and 69 in the central mold element, FIGS. 3 and 4, produce the ridges and projections 113 and 114 on the inner surfaces of the blade halves 30 and 32 respectively, FIGS.

9 and 10. Because these surfaces of the blade halves are readily visible when the halves are ready for assembly it is easy to make a complete and precise inspection to make sure that the projections are properly located and in a position to mate with one another. Thus, the configuration of projections and ridges are mirror images to one another when seen as in FIGS. 9 and 10.

After cooling and cleaning of the cast blade halves, and a complete inspection of both inner and outer surfaces, the two halves are assembled, and located by the cooperating projections and detents. They are then bonded together by any suitable process to provide a permanent attachment of the two halves into a complete blade. For example, this bonding may be accomplished by a technique known as TLP bonding in which a thin metallic film of a material or alloy that will bond with and diffuse into the alloy of the blade halves is placed between the mating surfaces of the halves. The assembled blade halves and interleaved thin film are placed in a furnace and heated to a temperature close to the melting temperature of the film, preferably at the same time pressing the two halves against one another. At this temperature the film will diffuse into the alloy of the blade halves and produce a satisfactory bond. It is essential that the mating bonding surfaces all be in contact with the film to assure a satisfactory bond. The above described casting technique permits such close dimensional control as to assure the desired contact.

The result is a turbine blade with the desired cooling passages within the blade and with complete dimensional control. Thus, as shown in FIG. 12, the hollow turbine blade with appropriate cooling passages in the internal cavity has the airfoil portion 115 and a root portion 116. At the top is the assembly and inspection portion in which the assembly detents and projections are located and in which the inspection and locating projections 108 are located. This portion is removed before the blade is ready for use.

The foregoing description of the process contemplates the use of the opposed blade halves from a single mold in the formation of a complete blade. This is assureed by the strongback center mold element. It is expected, however, that with adequate dimensional and mold strength controls, it will be possible to assemble convex and concave blade elements from different molds by reason of the accuracy permitted by this process.

Although the description has been directed to a moving turbine blade, the same technique is equally applicable to the manufacture of stationary turbine blades for the stationary rows of vanes or blades. Obviously, the revision of the outer mold elements to form integral platforms or shrouds on the blade halves as they are cast would be obvious. The invention further envisions making the outer mold elements with integral riser and filler spout cavities if so desired so that the mold will be complete for the casting operation when the mold elements are assembled.

The mold as above described envisions the production of columnnar grained articles as in VerSnyder U.S. Pat. No. 3,260,505. To produce the single crystal castings of Piearcey U.S. Pat. No. 3,494,709 the growth zone as shown would be replaced by a crystal selector growth zone as described in this Piearcey patent or other known types of crystal selector. Obviously, equi-axed castings may also be produced by this technique. The essential feature is the makeup of the mold elements from the best possible mold materials for the best strength and freedom of reaction with the alloy being cast.

It will be understood that this concept makes possible the precision casting of high temperature alloys by a technique that does not require the use of wax or the equivalent in the manufacture of the mold and also makes possible a precise inspection of the mold cavity prior to the casting operation. By this technique hollow cast articles such as turbine vanes or blades may be cast using refractory oxides for forming the mold surfaces for the internal surfaces of the article because they are removed readily from the cast articles without the need for leaching them from the article. These refractory oxides are presently considered to be most inert to the molten alloy being cast.

The ability to select different inert oxides for all parts of the mold including the central element permits a wide range of alloys to be used for blades and vanes without undesirable reaction between the mold and the molten alloy. Thus, desirable alloys that are not now used because they react with the materials of the conventional mold and core may now be used with appropriate mold material that does not react.

Referring now to FIG. 13, the invention contemplates making one of the outer mold members with an appropriate shape on the outer surface for another blade shape. Thus, there is an outer member 24' with a blade shape 20' on one surface, a central member 12' and another outer member 22'. This latter has, on the surface remote from central member 12' a blade shape or surface 20'' corresponding to the shape of surface 20' to cooperate with another central member 12''. In this arrangement the central members 12' and 12'' will be made of such a thickness, a strength and precision as to form the strongback of the mold and to produce cast blade halves of the necessary precision to permit assembly into complete blades as above described.

Thus, a stack of these mold members could be made up for producing a plurality of pairs of blade halves either simultaneously or successively if the mold assembly is positioned on a conveyor carrying the assembly past a pouring device. Such a mold assemblage could be set up in a ring arrangement for mounting about a central axis for multiple casting.

Figure 14:
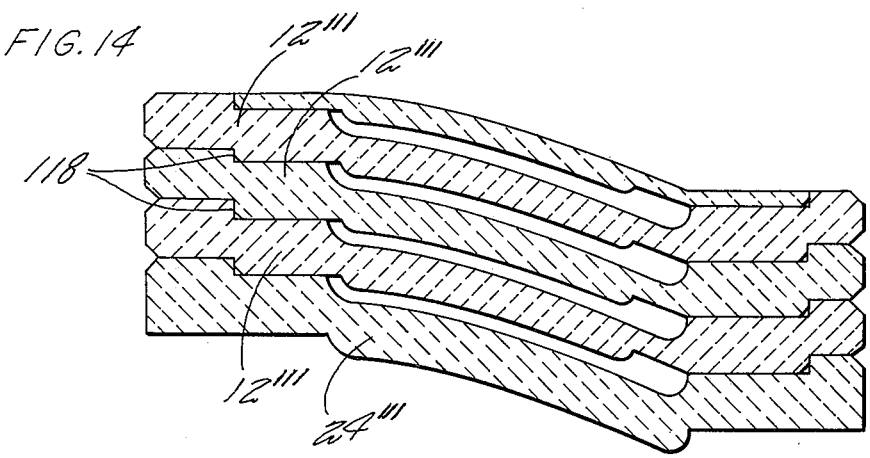
FIG. 14 is a view similar to FIG. 1 of a further modification.

Another alternative is an assembly for making all of one type of blade half at one time. As shown in FIG. 14, the mold assemblage is made up of a plurality of central members 12''', with one face cooperating with an end member 24''' and with each central member having duplicate surfaces on opposite surfaces thereby producing a plurality of the concave side of the vane at one time. Suitable locating notches 118 would be provided. With this arrangement, another set of molds would be necessary to provide the convex side of the blade.

Although the invention has been shown and described with respect to preferred embodiments thereof, it should be understood by those skilled in the art that various changes and omissions in the form and detail thereof may be made therein without departing from the spirit and the scope of the invention.

Having thus described typical embodiments of our invention, that which we claim as new and desire to secure by Letters Patent of the United States is:

1. A mold for making cooperating blade halves for forming hollow turbine blades and the like including:
   a central preformed mold element of a refractory oxide material having on each side at least part of the configuration of the hollow interior of the blade and having projecting flanges at opposite edges extending beyond the interior configurations;

said mold element being of adequate high strength and thickness to retain its shape during mold heating, pouring and cooling;

opposed outer mold elements of a refractory oxide material cooperating with and on opposite sides of the central element, each outer mold element having an inner wall surface corresponding to one outer surface of the finished blade, said outer elements cooperating with the central element to define a blade cavity on each side of the central cavity, said cavities forming cooperating blade halves to be subsequently bonded together; and the flanges on said central mold element having outer edges extending into engagement with and between the outer elements and said outer elements having similar outer edges extending beyond the blade surfaces thereon and between which the outer edges of the central element are positioned, said outer edges on the mold elements engaging one another for attachment together in forming the completed mold and in spacing the opposed cooperating surfaces of the mold cavities.

2. A mold as in claim 1 in which the outer mold elements have cooperating spaced surfaces at one end to define a growth cavity communicating with the mold cavities.

3. A mold as in claim 1 in which the outer mold elements all terminate in the same plane at the lower end to define two growth cavities on opposite sides of the central element.

4. A mold as in claim 1 in which the opposite surfaces of the central element that define cooperating portions of the blade halves that are bonded together in assembling the blade halves together are uniformly spaced apart by the thickness of the element to assure a mating of the blade parts.

5. A mold as in claim 1 in which the central mold element is formed on opposed surfaces with such precision that the portions of the element that form the cooperating surfaces on the blade halves that engage one another when said halves are assembled are precisely spaced apart in the element to produce properly mating blade halves.

6. In the manufacture of a cast hollow turbine blade, the steps of:

forming a central mold element of a strong refractory oxide material of such strength and thickness as to retain its shape without distortion during mold heating, pouring and cooling, said element having a configuration on each side corresponding to the configuration of the inner surfaces of the hollow blade and having projecting flanges at opposite edges extending beyond the blade configuration;

forming opposed outer mold elements of a refractory oxide to be positioned on opposite sides of the central element, one of said outer elements having an inner surface corresponding to the convex side of the blade and the other outer element having an inner surface corresponding to the concave side of the blade, said outer elements having side flanges projecting beyond the shaped inner surface thereon to engage with the flanges on the central element and thereby space the formed inner surfaces of the outer elements from the configurations on the central element to establish the desired wall thickness of the blade;

assembling the several mold elements to produce a cavity for a blade half on each side of the central element, the latter providing adequate strength to prevent distortion of the entire mold;

filling the mold cavities with molten alloy;

removing the cast blade halves from the mold when the alloy is solidified; and assembling the cast blade halves to form a complete blade.

7. The manufacture of a turbine blade as in claim 6 including the additional steps of:

heating the mold to a temperature above the melting point of the alloy;

positioning the assembled mold on a chill plate; and cooling the mold and the alloy therein by a controlled thermal gradient from the bottom to the top of the mold to form columnar growth therein.

8. In the manufacture of a turbine blade as in claim 6 including the additional steps of:

providing a growth zone cavity between the outer mold elements at the base thereof, and causing columnar crystalline growth in the growth zone at the start of alloy solidification to form such growth in the blade halves.

9. A mold for making cooperating blade halves to be assembled into a complete, hollow turbine blade including:

a central preformed mold element of a high strength refractory material of adequate thickness to avoid distortion during heating, pouring and cooling of the mold, said element imparting rigidity to the entire mold;

said central element having on each side thereof at least part of the configuration of the hollow interior of the blade, the configuration of cooperating blade halves being on opposite sides of the element, said element also having projecting flanges at opposite edges extending beyond said interior configurations;

a surrounding outer mold structure comprising opposed outer elements of a refractory material cooperating with and on opposite sides of the central element, each outer mold element having an inner wall surface corresponding to one outer surface of the finished blade and cooperating with the adjacent surface of the central element to form a mold cavity for casting one of the blade halves; and said outer elements having extensions at opposite edges defining therebetween a recess in which the outer edges of the flanges on the central mold element are received.

10. A mold as in claim 9 in which the central mold element is at least as long as the finished blade so that the blade halves when cast are separate from each other.

11. A mold as in claim 9 in which the outer mold structure is formed with a growth cavity at the end of the mold by which to produce columnar growth in the blade halves.

12. A mold as in claim 9 in which the blade cavities in the mold are open at one end and the mold elements terminate in a flat surface at this end for positioning on a chill plate with the ends of the cavities open to said plate.

* * * * *